(12) United States Patent  
Chang et al.

(10) Patent No.: US 7,838,173 B2
(45) Date of Patent: Nov. 23, 2010

(54) STRUCTURE DESIGN AND FABRICATION ON PHOTOMASK FOR CONTACT HOLE MANUFACTURING PROCESS WINDOW ENHANCEMENT

(75) Inventors: Ya Hui Chang, Hsin-Chu (TW); Tsiao Chen Wu, Hsin-Chu (TW); Shih-Che Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 357 days.

(21) Appl. No.: 11/565,743

(22) Filed: Dec. 1, 2006

(65) Prior Publication Data

US 2008/0131790 A1   Jun. 5, 2008

(51) Int. Cl.
*G03F 1/00* (2006.01)
*H01L 21/00* (2006.01)
(52) U.S. Cl. .......................... 430/5; 430/311
(58) Field of Classification Search ............. 430/5, 430/311
See application file for complete search history.

(56) References Cited

U.S. PATENT DOCUMENTS

| 5,288,569 | A | 2/1994 | Lin |
| 5,403,682 | A | 4/1995 | Lin |
| 6,436,587 | B1 * | 8/2002 | Ulrich et al. .................. 430/5 |
| 6,703,168 | B1 | 3/2004 | Misaka |
| 6,838,214 | B1 | 1/2005 | Chen |
| 2002/0177050 | A1 * | 11/2002 | Tanaka .......................... 430/5 |
| 2003/0027366 | A1 * | 2/2003 | Dulman et al. ................ 438/16 |
| 2003/0077520 | A1 * | 4/2003 | Smith ............................ 430/5 |

OTHER PUBLICATIONS

Stephen D. Hsu et al., "RET Integration of CPL Technology for Random Logic", Optical Microlithography XVII, edited by Bruce W. Smith, Proceedings of SPIE vol. 5377, pp. 510-526.
Takashi Yuito et al., "'Mask Enhancer' Technology for 45-nm Node Contact Hole Fabrication", 10 pages.
Van Den Broeke, Douglas, et al., "Contact and Via Hole Mask Design Optimization for 65nm Technology Node," 24th Annual BACUS Symposium on Photomask Technology, SPIE, vol. 5567, p. 680, 2004.

* cited by examiner

*Primary Examiner*—Stephen Rosasco
*Assistant Examiner*—Jonathan Jelsma
(74) *Attorney, Agent, or Firm*—Haynes and Boone, LLP

(57) ABSTRACT

The present disclosure provides a mask. The mask includes a substrate; a first attenuating layer disposed on the substrate, having a first material and a first thickness corresponding to a phase shift; and a second attenuating layer having a second material and disposed on the first attenuating layer. The first and second attenuating layers define a first feature having a first opening extending through the first and second attenuating layers; and a second feature having a second opening extending through the second attenuating layer and exposing the first attenuating layer. One of the first and second features is a main feature and the other one is an assistant feature proximate to the main feature.

22 Claims, 10 Drawing Sheets

US 7,838,173 B2

STRUCTURE DESIGN AND FABRICATION ON PHOTOMASK FOR CONTACT HOLE MANUFACTURING PROCESS WINDOW ENHANCEMENT

BACKGROUND

In semiconductor technologies, critical-dimension (CD) variations can be induced by optical interference and other effects. As a result, a mask error factor (MEF) will become too high and unacceptable for smaller feature sizes in sub-wavelength patterning, especially for contact holes. Various techniques have been implemented to improve MEF, including using a phase shift mask (PSM) and/or optical proximity correction (OPC) to form photomask patterns. However, conventional phase shift masks provide limited help on MEF control and quartz etching which is generally adopted for generation of multiple phases often introduce various issues, including increased manufacturing cost and reduced processing control (such as processing window relative to an expected phase shift).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
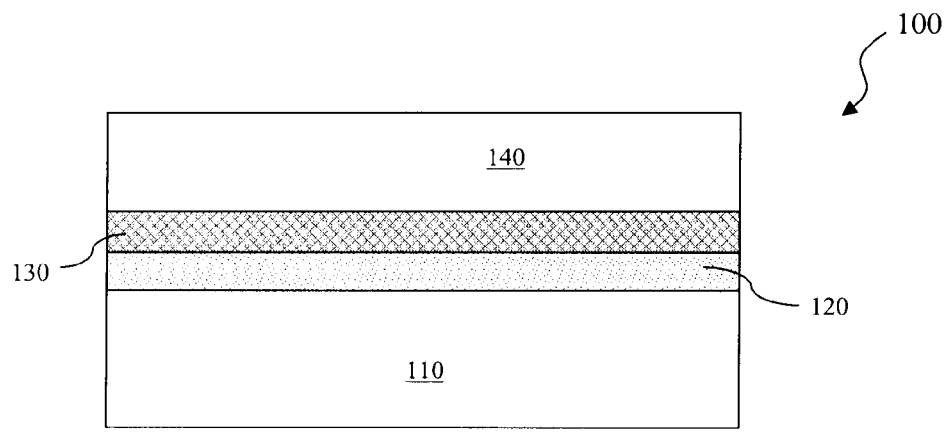
FIGS. 1a through 1e are sectional views of one embodiment of a photomask at various fabrication stages.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1a through 1e are sectional views of an embodiment of a photomask (mask, or reticle, collectively referred to as mask) 100 constructed according to aspects of the present disclosure. FIG. 1f is a top view of an embodiment of the mask 100 in FIG. 1e. Referring to FIGS. 1a through 1f, the mask 100 and a method of making the same are described.

Referring to FIG. 1a, the mask 100 may be a portion of a mask utilized in manufacturing a semiconductor wafer. The mask 100 includes a substrate 110. The substrate 110 may be a transparent substrate such as fused silica ($SiO_2$) relatively free of defects, calcium fluoride, or other suitable material.

The mask 100 includes a first attenuating layer 120 disposed on the substrate 110. The first layer 120 is designed to provide a phase shift to a radiation beam used to fabricate a semiconductor wafer during a lithography process. The first attenuating layer 120 may have a thickness such that a radiation beam directed toward and through the first attenuating layer 120 has a phase shift relative to the radiation beam directed through the air. The radiation beam is used on the mask 100 to form a pattern on a semiconductor wafer during a photolithography process. The radiation beam may be ultraviolet and/or can be extended to include other radiation beams such as ion beam, x-ray, extreme ultraviolet (EUV), deep ultraviolet (DUV), and other proper radiation energy. The thickness of the first attenuating layer 120 may have a tolerance of plus or minus about 15 degrees in terms of optical phase. In one embodiment, the first attenuating layer 120 has a phase shift about 180 degrees. More specifically, the first attenuating layer 120 may have a thickness about $\lambda/[2(n-1)]$, wherein $\lambda$ is the wavelength of the radiation beam projected on the mask 100 during a photolithography process, and n is refractive index of the first attenuating layer 120 relative to the specified radiation beam. In another embodiment, the first attenuating layer 120 may have a phase shift ranging between about 120 degrees and 240 degrees. Specifically, the first attenuating layer 120 may have a thickness ranging between $\lambda/[3x(n-1)]$ and $2\lambda/[3x(n-1)]$ to realize a desired phase shift. The first attenuating layer 120 may have a transmission less than one (or 100%) and more than zero. In another example, the first attenuating layer 120 may have a transmission higher than about 5%. The first attenuating layer 120 may include metal silicide such as MoSi or $ToSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or combinations thereof. The method of forming the first attenuating layer 120 may include chemical vapor deposition (CVD), physical vapor deposition (PVD), atomic layer deposition (ALD), plating, and/or other suitable processes.

The mask 100 includes a second attenuating layer 130 disposed on the first attenuating layer 120. The second layer 130 is designed as an absorption layer and is opaque to a radiation beam used for lithography processing. The second attenuating layer 130 has a transmission less than that of the first attenuating layer 120. In one embodiment, the second attenuating layer 130 has a transmission less than about 30%. The second attenuating layer 130 may utilize a material different from that of the first attenuating layer 120. The second attenuating layer 130 may be formed using a process similar to those used to form the first attenuating layer 120. The second attenuating layer 130 may include Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or a combination thereof. The method of forming the second attenuating layer 130 may include CVD, PVD, ALD, plating, and/or other suitable processes similar to those used to form the first attenuating layer.

A photoresist layer 140 is formed on the second attenuating layer 130 for lithography patterning. The photoresist layer 140 can be formed by a spin-on coating method. The photoresist layer 140 may include chemical amplification resist (CAR).

Figure 1B:
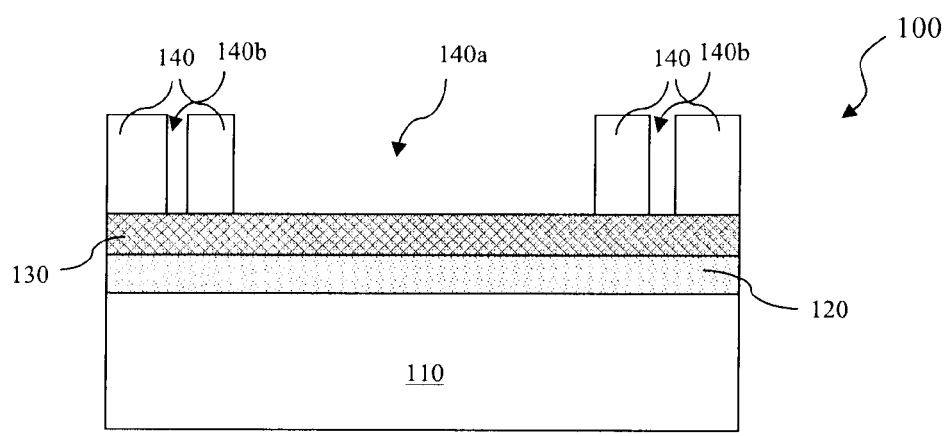

Referring to FIG. 1b, the photoresist layer 140 is patterned to form various openings such as openings 140a and 140b, designed according to aspects of the present disclosure, using a conventional process or a future developed technique. The second attenuating layer 130 is exposed within the openings 140a and 140b. In one example, the photolithography process includes soft baking, mask aligning, exposing, post-exposure baking, developing photoresist, and hard baking.

Figure 1C:
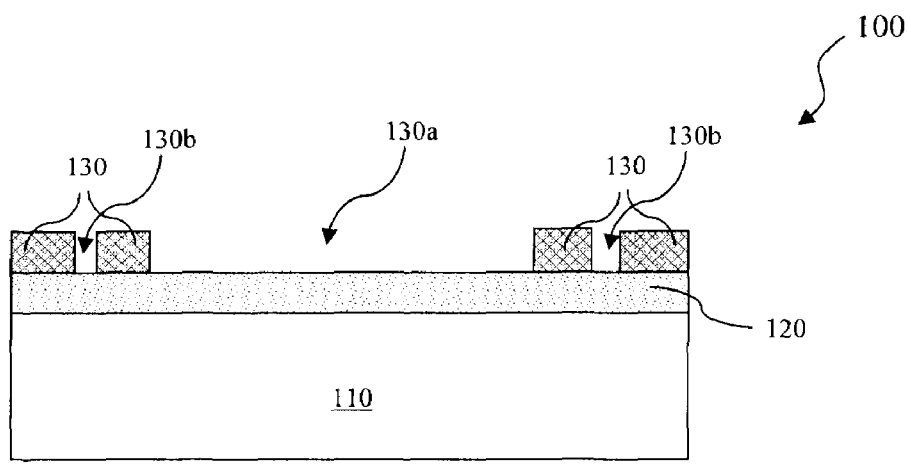

Referring to FIG. 1c, the second attenuating layer 130 is etched through the patterned photoresist layer 140 to form various openings 130a and 130b in the second attenuating layer 130 within the openings 140a and 140b. The first attenuating layer 120 is therefore exposed within the openings 130a and 130b. The etchant to etch the second attenuating layer 130 may be chosen or designed to have a higher etching selectivity over the first attenuating layer 120. The etchant may include halogens species such as fluorine, chlorine and bromine. The etch selectivity is preferred to be no less than about 10. The patterned photoresist layer 140 is removed after the etching of the second attenuating layer 130, using either wet stripping or plasma ashing.

Figure 1D:
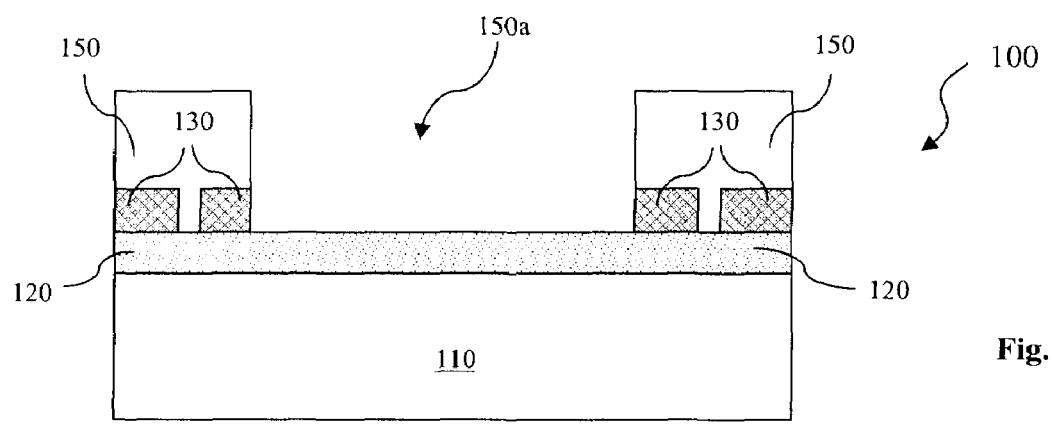

Referring to FIG. 1d, another photoresist layer 150 is formed on the first attenuating layer 120 within the openings 130a and 130b and on the patterned second attenuating layer 130. The photoresist layer 150 is then further patterned to form an opening 150a in the photoresist layer 150 to expose the underlying first attenuating layer 120 within the opening 150a. The photoresist layer 150 and the patterning thereof may be substantially similar to the photoresist layer 140 and the patterning thereof.

Figure 1E:
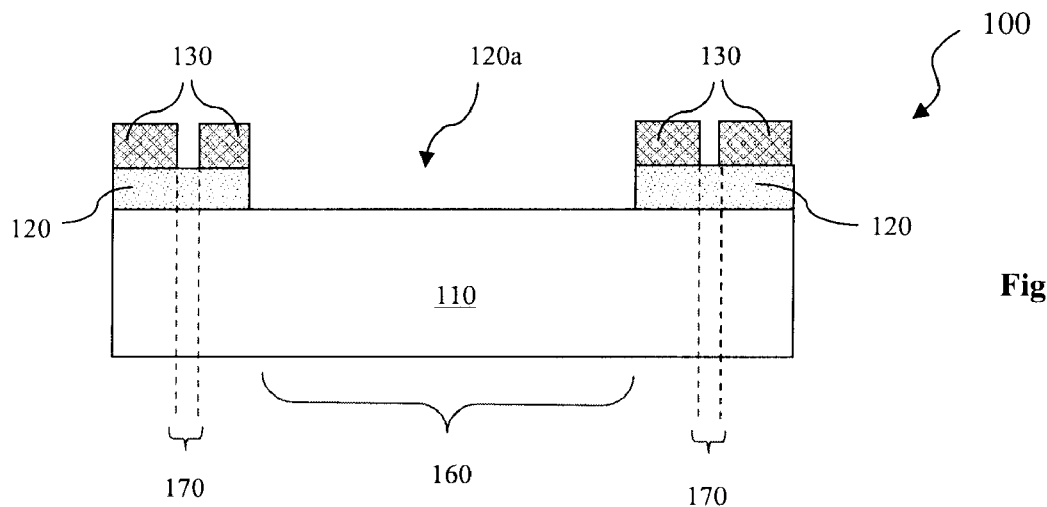
Figure 1F:
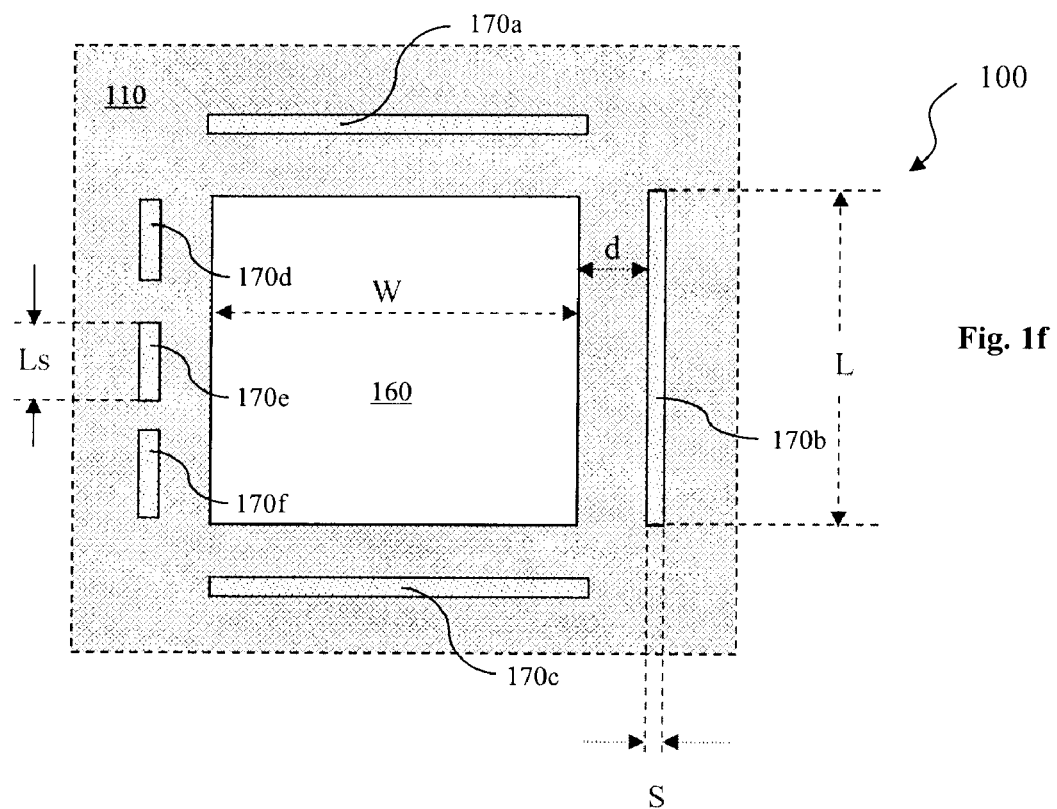
FIG. 1f is a top view of an embodiment of the photomask of FIG. 1e.

Referring to FIGS. 1e and 1f, the first attenuating layer 120 is etched through the patterned photoresist layer 150 to form an opening 120a in the first attenuating layer 120 within the openings 150a. The substrate 110 is thereafter exposed within the opening 120a. The etchant to etch the first attenuating layer 120 may be designed to have a higher etching selectivity over the substrate 110. The etch selectivity is preferred to be no less than about 10. The patterned photoresist layer 150 is removed thereafter, using either wet stripping or plasma ashing.

The formed mask 100 includes a region 160 and a region 170, as illustrated in FIGS. 1e and 1f, which are referred to as a main feature 160 and an assistant feature 170, respectively. The main feature 160 is designed to form an integrated circuit pattern on a semiconductor wafer or other substrates. For example, the main feature 160 is designed to form a contact hole for an integrated circuit in a semiconductor wafer. The illustrated main feature for a contact hole is used only as an example, which can be designed in various other shapes and dimensions, and may be further designed to include other resolution enhancement features. Alternatively, the main feature 160 may be designed for other integrated circuit patterns such as a conductive line, source/drain, a gate feature, or a doped region. The main feature 160 has a width labeled as "W" in FIG. 1f.

The assistant feature 170 may be a scattering bar having a phase shift relative to the main feature 160. The assistant feature 170 includes exemplary segments 170a through 170f illustrated in FIG. 1f. Since the assistant feature 170 includes the first attenuating layer 120 while the main feature 160 does not, a radiation beam directed through the assistant feature 170 can have a phase shift relative to the radiation beam directed through the main feature, such as about 180 degrees or other designed phase shifts according to the thickness and refractive index of the first attenuating layer, as described above regarding to the first attenuating layer 120. The assistant feature 170 is spaced away from the main feature 160 with a distance labeled as "d" in FIG. 1f. The distance "d" may have a range up to multiple times of the width "W" of the main feature 160. Preferably, the distance "d" may have a range up to no greater than the four times of the width "W" of the main feature 160. The distance "d" may have a minimum dimension achievable in mask fabrication. The assistant feature 170 may have a width labeled as "S" and a length labeled as "L" in FIG. 1f. The width "S" of the assistant feature may be up to no greater than about two third of the width "W" of the main feature 160. The length "L" of the assistant feature may also have a range up to multiple times of the width "W" of the main feature 160. The assistant feature 170 may include several segments separate or connected. In one example, the assistant feature 170 may include various separate regions 170a through 170f disposed around the main feature 160 as illustrated in FIG. 1f. The smallest segment of the assistant feature 170 (such as 170e) may have a length "Ls" no less than about the minimum dimension achievable in mask fabrication. The distance between neighboring segments is no less than about the length "Ls". The assistant feature may alternatively be designed in other shapes, dimensions, and configurations. In various embodiment, the assistant feature may be designed to be rectangular, annular, a segment, or combinations thereof. In one example, various segments may be combined and connected to enclose the main feature inside.

FIGS. 3a through 3l illustrate other embodiments of the main feature and the assistant feature in various shapes and configurations. Those are illustrative and are not intended to be limiting. If two or more main features are disposed next to each other in a mask pattern, corresponding assistant features to each main feature may be properly combined. FIGS. 4a through 4g illustrate various embodiments of two main features and corresponding assistant features according to aspects of the present disclosure. They are also illustrative and are not intended to be limiting. Since a phase shift between the main feature 160 and the assistant feature 170 is achieved through the first attenuating layer 120, substrate etching (such as quartz etching) is eliminated. Therefore, the method according to the present disclosure, without quartz etching, may reduce the manufacturing cost, provide better processing control over the designed phase shift (through film deposition and thickness control instead of etching control), and enhance a manufacturing process window.

Figure 2A:
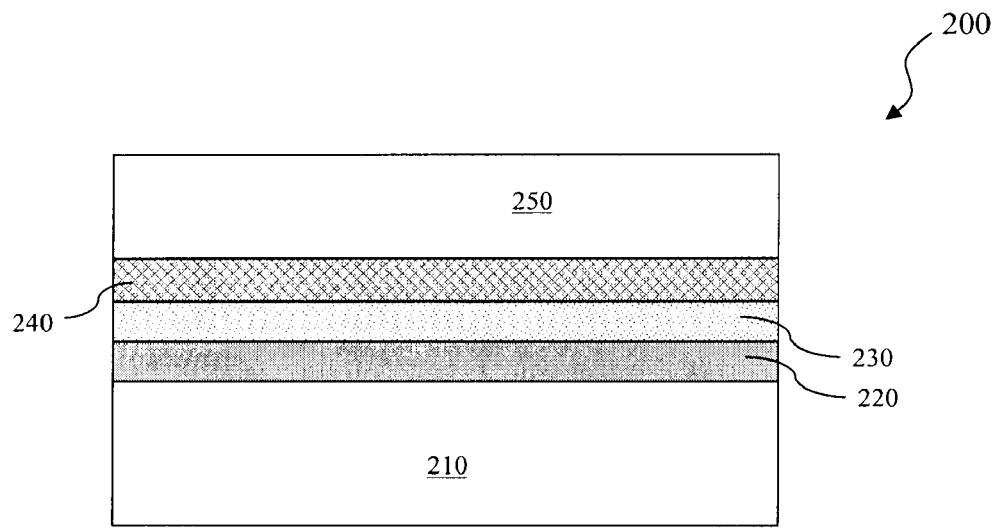
FIGS. 2a through 2e are sectional views of another embodiment of a photomask at various fabrication stages.

Referring to FIG. 2a, a mask 200 includes a substrate 210, substantially similar to the substrate 110 of the mask 100. The mask 200 includes a first attenuating layer 220 disposed on the substrate 210, a second attenuating layer 230 disposed on the first attenuating layer 220, and a third attenuating layer 240 disposed on the second attenuating layer 230. The first and second attenuating layers 220 and 230 may be similar to the first attenuating layer 120 of the mask 100 in terms of composition and formation. However, each of the first and second attenuating layers 220 and 230 may include an individual material and have an individual thickness to provide an intended phase shift to a radiation beam projected there through during a lithography patterning process to fabricate a semiconductor wafer. For example, the first attenuating layer 220 may include MoSi and have a thickness being capable of achieving about 180 degrees phase shift. The second attenuating layer 230 may include $TiSi_2$ and may have a thickness being capable of achieving about 90 degrees phase shift. The third attenuating layer 240 may be similar to the second attenuating layer 130 of the mask 100 in terms of composition, formation, and performance. The third attenuating layer 240 may provide an absorption layer to a radiation beam projected thereon during a lithography patterning process to fabricate a semiconductor wafer. In one example, the third attenuating layer 240 may have a transmission no greater than about 30%. A photoresist layer 250 is formed on the third attenuating layer 240 similar to photoresist layers used to form the mask 100 in terms of composition and formation.

Figure 2B:
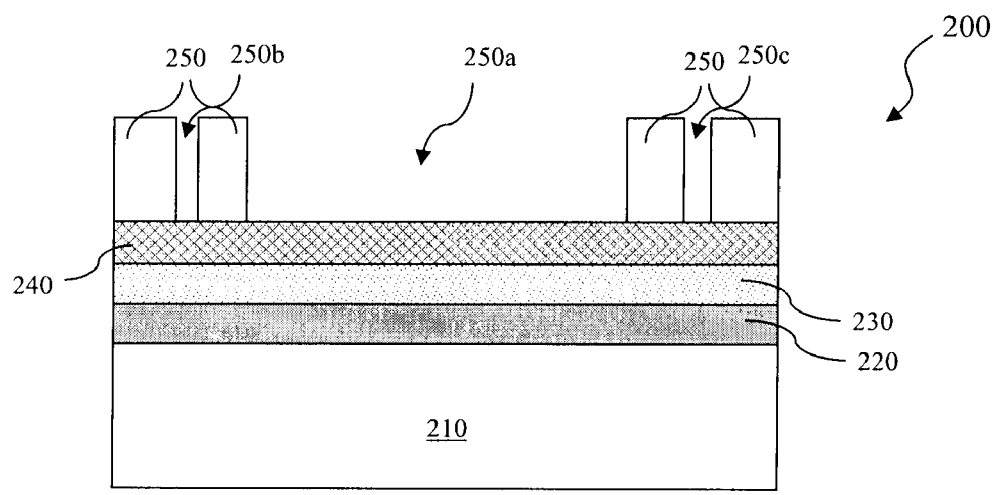

Referring to FIG. 2b, the photoresist layer 250 is patterned to form openings 250a and 250b, similar to the process of patterning the photoresist layer 140. The third attenuating layer 240 is thereafter exposed within the openings 250a, 250b, and 250c. In one example, the photoresist layer 250 may be formed by a spin-on coating method and may include chemical amplification resist (CAR). In one example, the process to form and pattern the photoresist layer 250 may include soft baking, mask aligning, exposing, post-exposure baking, developing, and hard baking.

Figure 2C:
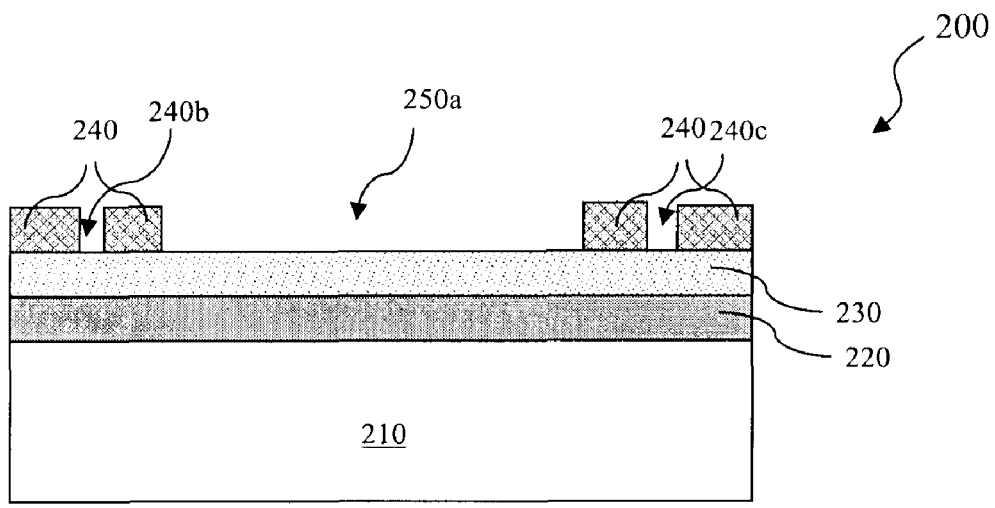

Referring to FIG. 2c, the third attenuating layer 240 is etched through the patterned photoresist layer 250 and within the openings 250a, 250b, and 250c, resulting in openings 240a, 240b, and 240c in the third attenuating layer. The second attenuating layer 230 is exposed within the openings 240a, 240b, and 240c. The photoresist layer 240 may then be removed thereafter by either plasma ashing or wet stripping.

Figure 2D:
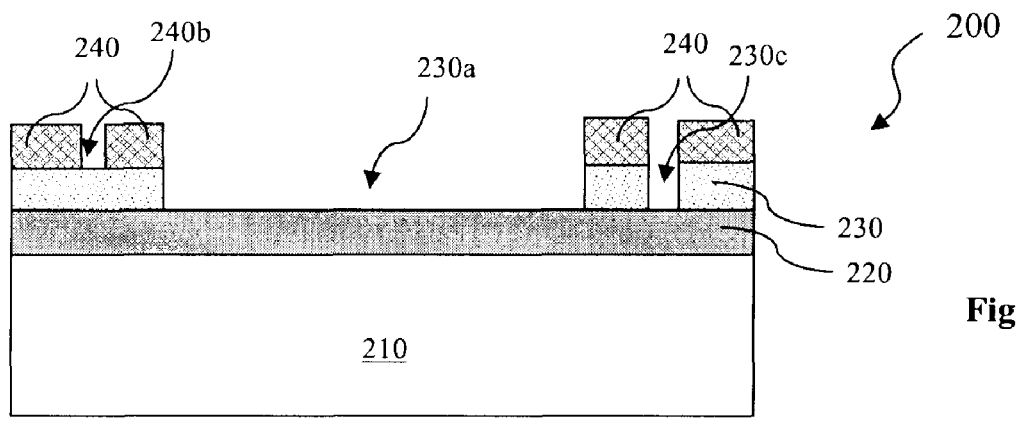

Referring to FIG. 2d, the second attenuating layer 230 is patterned to form openings 230a and 230c in the second attenuating layer 230, in a way substantially similar to the process of patterning the third attenuating layer 240.

Figure 2E:
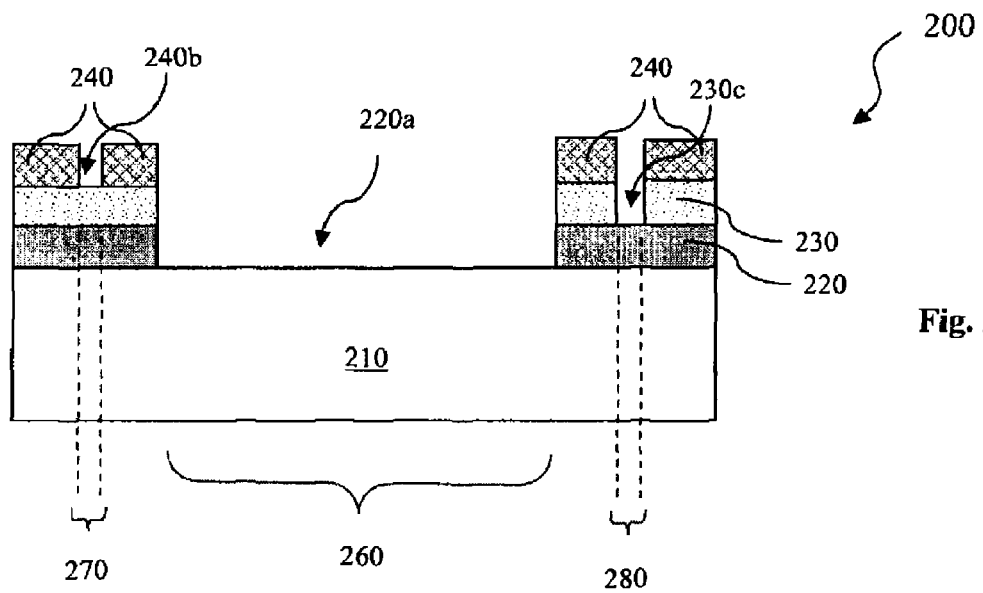
Figure 2F:
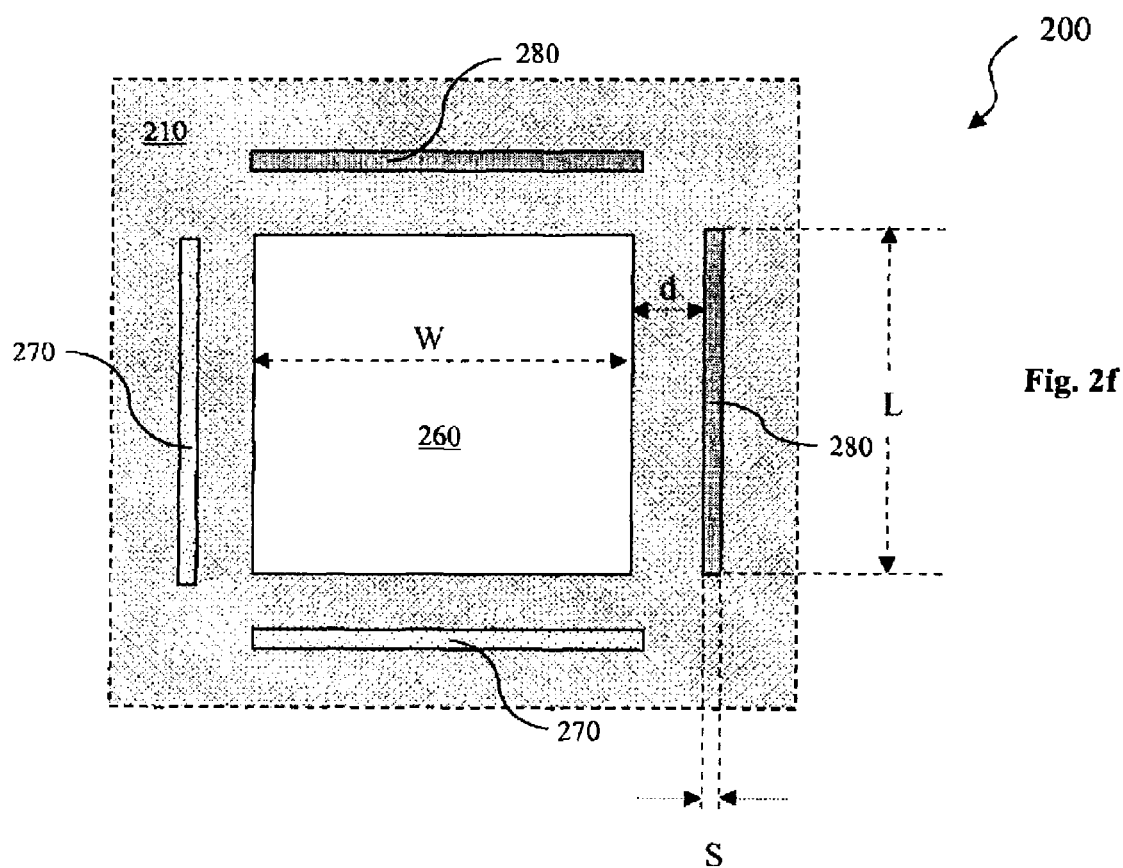
FIG. 2f is a top view of one embodiment of the photomask of FIG. 2e.
Figure 3A:
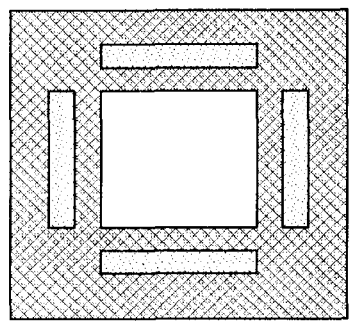
FIGS. 3a through 3l are top views of various embodiments of a photomask pattern constructed according to aspects of the present disclosure.
Figure 3B:
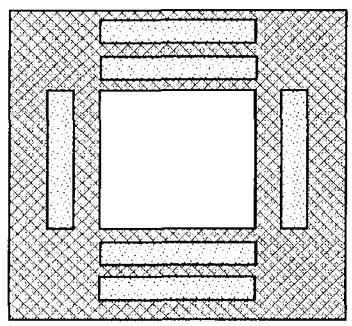
Figure 3C:
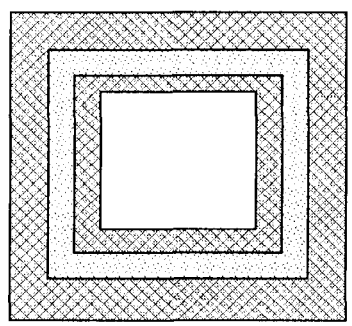
Figure 3D:
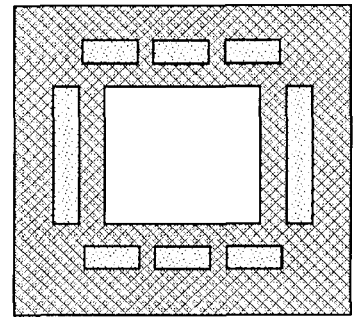
Figure 3E:
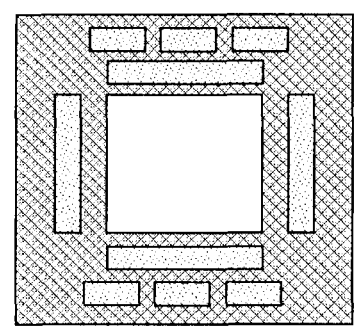
Figure 3F:
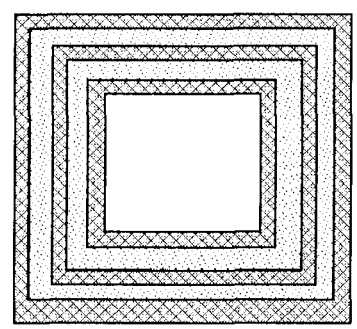
Figure 3G:
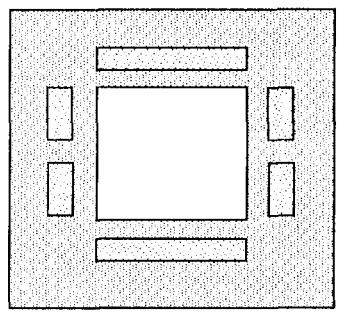
Figure 3J:
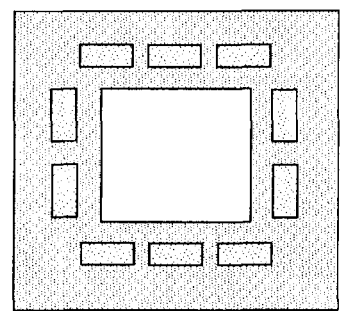
Figure 3H:
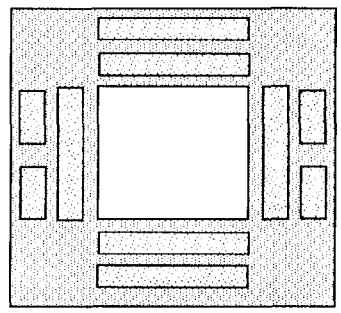
Figure 3K:
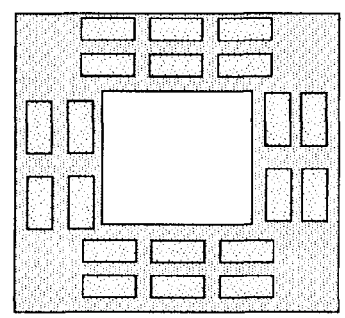
Figure 3I:
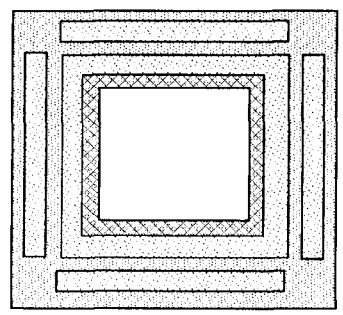
Figure 3L:
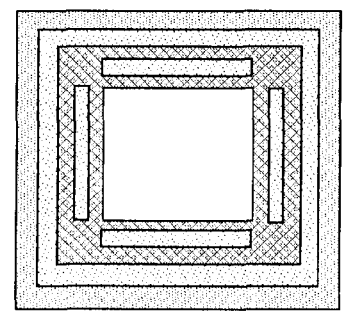
Figure 4A:
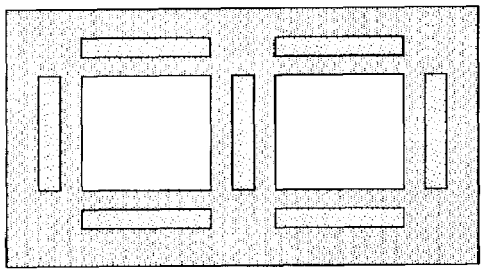
FIGS. 4a through 4g are top views of various embodiments of a combined photomask pattern constructed according to aspects of the present disclosure.
Figure 4D:
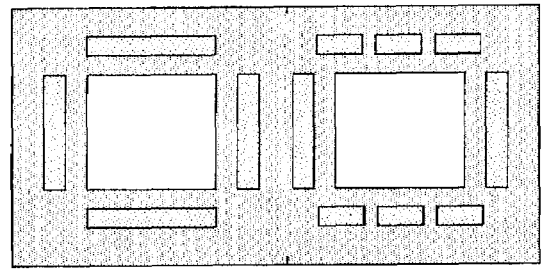
Figure 4B:
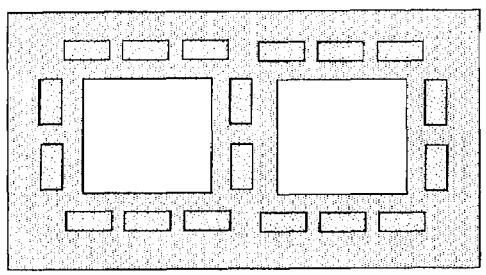
Figure 4E:
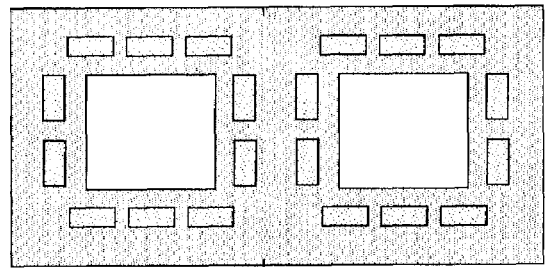
Figure 4C:
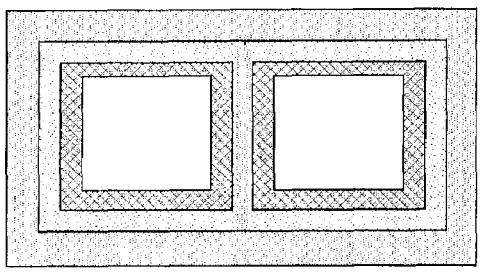
Figure 4F:
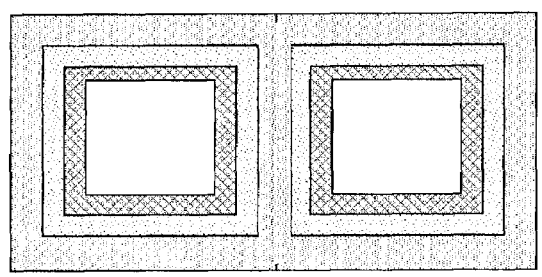
Figure 4G:
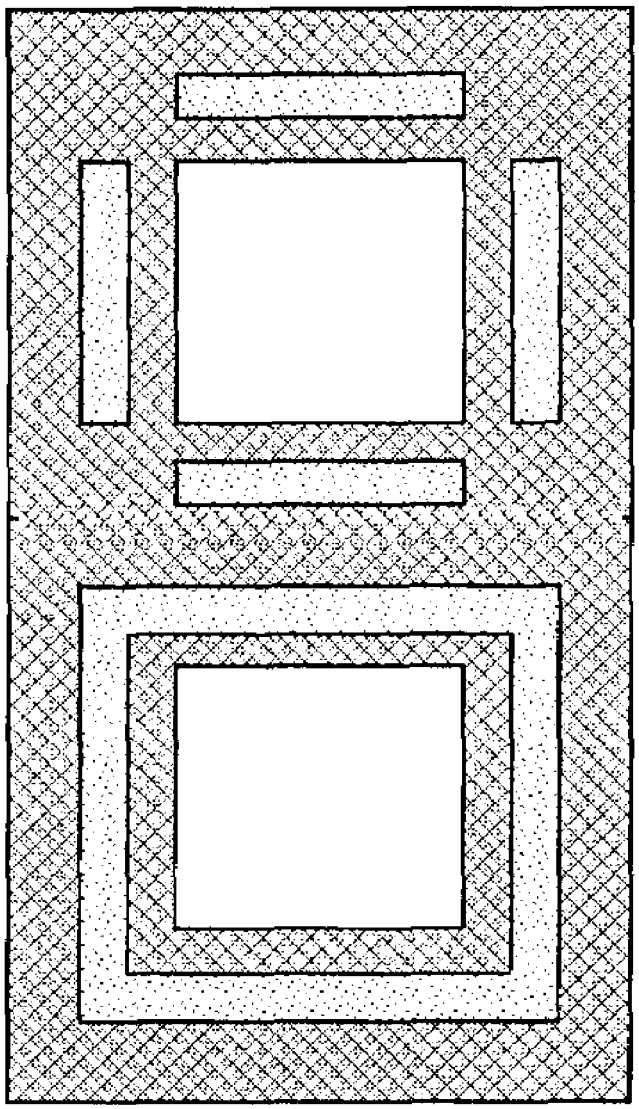

Referring to FIGS. 2e and 2f, the first attenuating layer 220 is patterned to form an opening 220a in the first attenuating layer 220, in a way substantially similar to the process of patterning the third attenuating layer 240. The formed mask 200 includes various features such as regions 260, 270, and 280, which are referred to, respectively, as a main feature 260, a first assistant feature 270, and a second assistant feature 280. The main feature 260 may be designed to form an integrated circuit (IC) pattern such as a contact hole in a semiconductor wafer. The first assistant feature 270 includes both the first and second attenuating layers 220 and 230 while the second assistant feature 280 includes the first attenuating layer 220 but not the second attenuating layer 230. Thus the first assistant feature 270 and the second assistant feature 280 can provide different phase shifts relative to the main feature 260. The assistant features 270 and 280 may be designed in various geometrical dimensions and configurations, relative to the main feature 260, substantially similar to the geometrical dimensions and configurations of the assistant feature 170 relative to the main feature 160 in the mask 100, as illustrated in FIGS. 1e, 1f, 3a through 3l, and 4a through 4g. Since three attenuating layers are utilized, assistant features can be realized with more than one phase shifts, when expected.

The mask structures and processes making thereof, as described above, may have variations without departure from the spirit and the scope of the present disclosure. For example, the lithography patterning used to pattern various attenuating layers may be alternatively implemented or replaced by other proper methods such as electron-beam writing, ion-beam writing, maskless lithography, and molecular imprint. In an alternative embodiment of the mask 100 illustrated in FIGS. 1e and 1f, the main feature 160 includes the first attenuating layer 120 but the assistant feature 170 does not. The mask 200 illustrated in FIGS. 2e and 2f, may have similar variations and still achieve various phase shifts between the main feature and the assistant features. In another embodiment, the mask 200 may be extended to include more then three attenuating layers to realize multiple phase-shift assistant features. In further embodiment, each attenuating layer may include more than one film for optimized manufacturing and performance. The masks 100 and/or 200 may not only be used to fabricate a semiconductor wafer, but may be alternatively used to pattern other substrates such as a glass substrate used to form a thin film transistor liquid crystal display (TFT-LCD) substrate. An assistant feature is not limited to various embodiments illustrated in FIGS. 1e, 1f, 2e, 2f, 3a through 3l, and 4a through 4g. An assistant feature may include various combinations of a broken line, an array of squares (or rectangles), a column of polygons, a distributed bars, a combination of various geometric features, and/or combinations thereof.

Thus the present disclosure provides a mask. In one embodiment, the mask includes a substrate; a first attenuating layer disposed on the transparent substrate, having a first material and a first thickness corresponding to a predefined phase shift; and a second attenuating layer having a second material and disposed on the first attenuating layer. The first and second attenuating layers define a first feature having a first opening extending through the first and second attenuating layers and exposing the transparent substrate; and a second feature having a second opening extending through the second attenuating layer and exposing the first attenuating layer, wherein one of the first and second features is a main feature and the other one is an assistant feature proximate to the main feature.

In the mask, the main feature and the assistant feature may be spaced from one another in a first dimension and define a first distance between the main feature and the assistant feature. The main feature has a first and second outlines defining a width of the main feature in the first dimension, the first distance having a range up to multiple times of the width of the main feature. Preferably, the first distance may be no greater than four times of the width of the main feature. The first distance may have a minimum dimension achievable in mask fabrication. The assistant feature has a third and fourth outlines defining a width of the assistant feature in the first dimension. The width of the assistant feature may be less than two third of the width of the main feature. The assistant feature has a fifth and sixth outlines defining a length of the assistant feature in a second dimension perpendicular to the first dimension. The length of the assistant feature may have a range up to multiple times of the width of the main feature. The assistant feature may also include several segments, and the smallest segment of the assistant feature may have a length "$L_s$" no less than about a minimum dimension achievable in mask fabrication. A distance between two neighboring segments is no less than about the length "$L_s$". Preferably, the length of the assistant feature may be greater than about half of and less than four times of the width of the main feature. The predefined phase shift regarding to the first attenuating layer may be about 180 degrees with a tolerance of plus or minus about 15 degrees with regard to a radiation beam for lithography processing. The first attenuating layer may include a transmission larger than zero and less than one. The second attenuating layer may have a transmission less than the transmission of the first attenuating layer. The second attenuating layer may have a transmission less than about 30%.

In another embodiment, a mask includes a substrate; a first attenuating layer having a first transmission, disposed on the substrate; a second attenuating layer having a second transmission less than the first transmission and disposed on the first attenuating layer; a main feature on the substrate, defining a first opening extending through the first and second attenuating layers; and an assistant feature on the substrate, defining a second opening extending through the second attenuating layers, and being spaced a distance from the main feature.

In this mask, the assistant feature may have a transmission less than one. The assistant feature may be designed to have a phase shift ranging between about 120 degree and 240 degree relative to the main feature. The main feature may be designed to form an integrated circuit pattern on a semiconductor wafer. The integrated circuit pattern may include a contact hole. The assistant feature may include a scattering bar. This mask may further include additional assistant features disposed around the main feature. The substrate may include a material selected from the group consisting of fused quartz, calcium fluoride, and combinations thereof. The second attenuating layer may include a material selected from the group consisting of Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, and combinations thereof. This mask may further include a third attenuating layer interposed between the first attenuating layer and the substrate; and another feature defining an opening extending through the first, second, and third attenuating layers. Each of the first and third attenuating layers may include a material selected from the group consisting of metal silicide, metal nitride, and combinations thereof. The assistant feature may include a shape selected from the group consisting of a rectangle, an annular shape, a segment, and combinations thereof.

The present disclosure also provides a method of making a mask. In one embodiment, the method includes providing a substrate; forming a first attenuating layer on the substrate; forming a second attenuating layer on the first attenuating layer; patterning the first and second attenuating layers to form a first opening extending through the first and second attenuating layers; and patterning the second attenuating layer to form a second opening extending through the second attenuating layer, wherein the first and second openings are spaced from one another.

The method may further include forming a third attenuating layer between the first attenuating layer and the substrate. The method may further include patterning the first, second, third attenuating layers to form a third opening extending through the first, second, and third attenuating layer. In one embodiment, a main feature defines an opening that extends through the first and second attenuating layers, and exposes the third attenuating layer. An assistant feature defines at least one opening that extends through the second attenuating layer, and exposes the first attenuating layer. In another embodiment, a main feature defines an opening that extends through the first, second, and third attenuating layers, and exposes the substrate. An assistant feature defines at least one opening that extends through the second attenuating layer, and exposes the first attenuating layer. In a further embodiment, a main feature defines an opening that extends through the first, second, and third attenuating layers, and exposes the substrate. An assistant feature defines at least one opening that extends through the first and second attenuating layers, and exposes the third attenuating layer. The disclosed method may have other variations such as forming three or more than three attenuating layers and defining various openings each extending through proper attenuating layers in a particular combination.

The present disclosure also provides a method of an integrated circuit (IC) fabrication. The method includes providing a substrate; providing a mask, and forming an integrated circuit pattern on the substrate by utilizing the mask in a lithography process, wherein the mask includes a first attenuating layer having a first transmission, disposed over a mask substrate; a second attenuating layer having a second transmission less than the first transmission and disposed over the first attenuating layer; a main feature on the mask substrate, defining a first opening, wherein the first opening exposing a first surface; and an assistant feature on the mask substrate, defining a second opening exposing a second surface different from the first surface, and being spaced a distance from the main feature.

In the disclosed method of the IC fabrication, the mask may further include a third attenuating layer disposed between the first attenuating layer and the mask substrate. The mask may further include a third opening exposing a third surface different from the first surface.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A mask comprising:
   a substrate;
   a first attenuating layer disposed on the substrate, having a first material and a first thickness;
   a second attenuating layer having a second material and disposed on the first attenuating layer; and
   a third attenuating layer interposed between the first attenuating layer and the substrate, wherein the first, second, and third attenuating layers define:
   a first feature having a first opening extending through the first, second, and third attenuating layers, wherein the first feature is a main feature; and
   a second feature having a second opening extending through the second attenuating layer and exposing the first attenuating layer, wherein the second feature is a first assistant feature proximate to the main feature and has a first phase shift relative to the main feature, the first phase shift being in a range such that the main feature and the second feature are out of phase; and
   a third feature having a third opening extending through the second and first attenuating layers and exposing the third attenuating layer, wherein the third feature is a second assistant feature proximate to the main feature and has a second phase shift relative to the main feature, the second phase shift being different from the first phase shift.

2. The mask of claim 1, wherein the first opening exposes the substrate.

3. The mask of claim 1, wherein the main feature and at least one of the first and second assistant features is spaced from one another in a first dimension and define a first distance between the main feature and the first or second assistant feature.

4. The mask of claim 3, wherein the main feature includes first and second outlines defining a width of the main feature in the first dimension, the first distance being no greater than about four times of the width of the main feature.

5. The mask of claim 4, wherein the first assistant feature includes third and fourth outlines defining a width of the first assistant feature in the first dimension, the width of the first assistant feature being less than two third of the width of the main feature.

6. The mask of claim 4, wherein the first assistant feature includes fifth and sixth outlines defining a length of the first assistant feature in a second dimension perpendicular to the first dimension, the length of the first assistant feature being no greater than about four times of the width of the main feature.

7. The mask of claim 1, wherein the second attenuating layer has a transmission less than that of the first attenuating layer.

8. The mask of claim 1, wherein the first phase shift is approximately 270 degrees, and wherein the second phase shift is approximately 180 degrees.

9. The mask of claim 1, wherein the first and second assistant features are disposed on opposite sides of the main feature.

10. A mask comprising:
   a substrate;
   a first attenuating layer having a first transmission, disposed over the substrate;
   a second attenuating layer having a second transmission less than the first transmission and disposed over the first attenuating layer;
   a third attenuating layer interposed between the first attenuating layer and the substrate;
   a main feature on the substrate, defining a first opening in the first, second, and third attenuating layers;
   a first assistant feature on the substrate, defining a second opening in the second attenuating layer, the first assistant feature being spaced a first distance from the main feature and having a first phase shift relative to the main feature, the first phase shift being in a range such that the main feature and the first assistant feature are out of phase; and
   a second assistant feature on the substrate, defining a third opening in the first and second attenuating layers, wherein the second assistant feature has a second phase shift relative to the main feature and is spaced a second distance from the main feature, the second phase shift being different from the first phase shift.

11. The mask of claim 10, wherein the main feature is designed to form an integrated circuit pattern on a semiconductor wafer.

12. The mask of claim 10, wherein the first and second distances each extend in a first direction, and further comprising additional assistant features disposed around the main feature, the additional features being spaced from the main feature in a second direction that is approximately perpendicular to the first direction.

13. The mask of claim 10, wherein the second attenuating layer comprises a material selected from the group consisting of Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, and combinations thereof.

14. The mask of claim 10, wherein each of the first and third attenuating layers comprises a material selected from the group consisting of metal silicide, metal nitride, and combinations thereof.

15. The mask of claim 10, wherein each of the first and second assistant features comprises a shape selected from the group consisting of a rectangle, an annular shape, a segment, and combinations thereof.

16. The mask of claim 10, wherein the second distance is different from the first distance.

17. The mask of claim 10, wherein the second phase shift is different from the first phase shift by about 90 degrees.

18. The mask of claim 10, wherein the first and second assistant features are disposed on opposite sides of the main feature.

19. The mask of claim 10, wherein the first and second assistant features are each disposed proximate to the main feature.

20. A method of an integrated circuit fabrication, comprising:
   providing a substrate;
   providing a mask including
      a first attenuating layer having a first transmission, disposed over a mask substrate;
      a second attenuating layer having a second transmission less than the first transmission and disposed over the first attenuating layer;
      a third attenuating layer disposed between the first attenuating layer and the mask substrate;
      a main feature on the mask substrate, defining a first opening, wherein the first opening exposes a first surface; and
      a first assistant feature on the mask substrate, defining a second opening exposing a second surface different from the first surface, having a first phase shift relative to the main feature, and being spaced a first distance from the main feature, wherein the first phase shift is in a range such that the main feature and the first assistant feature are out of phase;
      a second assistant feature on the mask substrate, defining a third opening exposing a third surface different from the first and second surfaces, having a second phase shift relative to the main feature, and being spaced a second distance from the main feature, wherein the second phase shift is different from the first phase shift; and
   forming an integrated circuit pattern on the substrate by utilizing the mask in a lithography process.

21. The method of claim 20, wherein the first and second assistant features are disposed on opposite sides of the main feature.

22. The method of claim 20, wherein the first and second assistant features are each disposed proximate to the main feature.

* * * * *